United States Patent
Späth

[19]

[11] Patent Number: 5,925,898
[45] Date of Patent: Jul. 20, 1999

[54] OPTOELECTRONIC TRANSDUCER AND PRODUCTION METHODS

[75] Inventor: Werner Späth, Holzkirchen, Germany

[73] Assignee: Siemens Aktiengesellschaft, Munich, Germany

[21] Appl. No.: 09/013,292

[22] Filed: Jan. 26, 1998

Related U.S. Application Data

[63] Continuation of application No. PCT/DE96/01316, Jul. 18, 1996.

[51] Int. Cl.[6] .................... H01L 33/00; H01L 31/0232; H01L 31/0203
[52] U.S. Cl. ........................... 257/98; 257/99; 257/432; 257/433
[58] Field of Search ................ 257/98, 99, 432, 257/433

[56] References Cited

U.S. PATENT DOCUMENTS

| | | | |
|---|---|---|---|
| 5,255,333 | 10/1993 | Althaus et al. | 385/33 |
| 5,600,741 | 2/1997 | Hauer et al. | 385/35 |

FOREIGN PATENT DOCUMENTS

| | | |
|---|---|---|
| 0412184A1 | 2/1991 | European Pat. Off. . |
| 0514283A2 | 11/1992 | European Pat. Off. . |
| 3925189C1 | 12/1990 | Germany . |
| 4313486A1 | 6/1994 | Germany . |
| 4323681A1 | 1/1995 | Germany . |
| 4416563C1 | 7/1995 | Germany . |
| 92/10856 | 6/1992 | WIPO . |

OTHER PUBLICATIONS

"Infrared High–Power Light–Emitting Diodes Expected to Evolve to New Applications", Youichi Yasuda, IEEE Journal of Electronic Engineering, May 26, 1989, No. 270, Tokyo, Japan, pp. 52–54.

Japanese Patent Abstract No. 60153184 (Masataka), dated Dec. 17, 1985.

*Primary Examiner*—Mahshid Saadat
*Assistant Examiner*—Jhihan B. Clark
*Attorney, Agent, or Firm*—Herbert L. Lerner; Laurence A. Greenberg

[57] ABSTRACT

An optoelectronic transducer configuration has a radiation-emitting and/or receiving semiconductor component fastened to a carrier plate in such a way that its beam exit/entry face is directed towards the carrier plate. The carrier plate is composed of a material which is transparent to the radiation. A device for focusing the radiation is additionally disposed on the carrier plate. The optoelectronic transducer is distinguished in particular by low reflection losses and simple mounting. A multiplicity of such transducers can be fabricated as a unit and then separated.

9 Claims, 4 Drawing Sheets

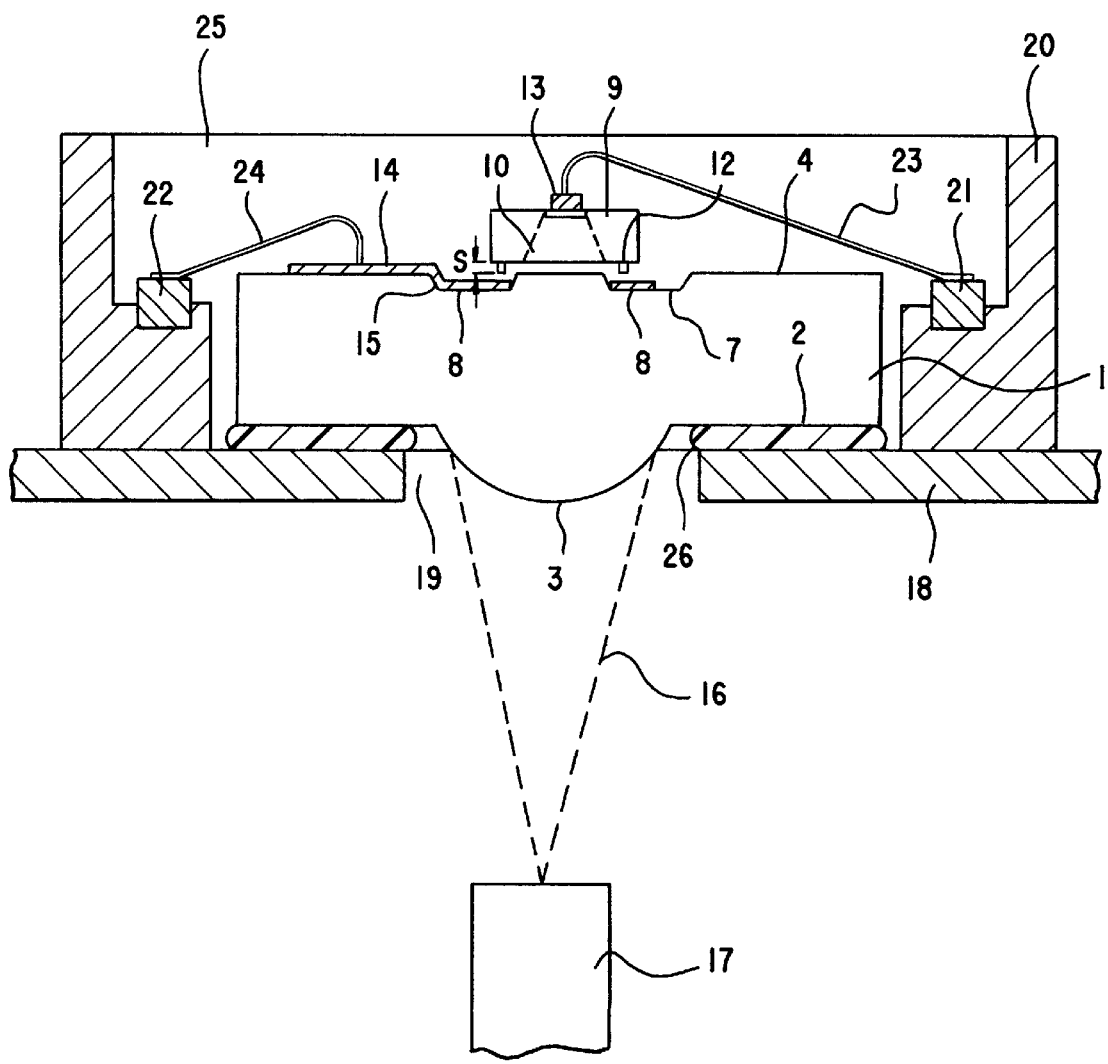

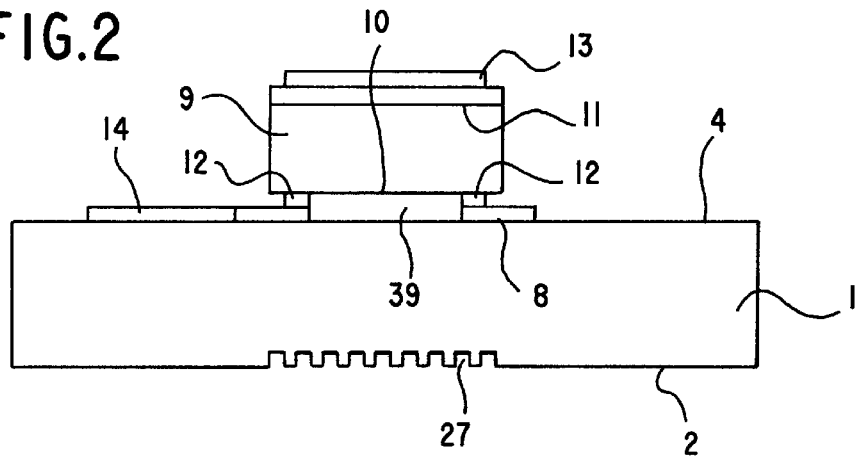
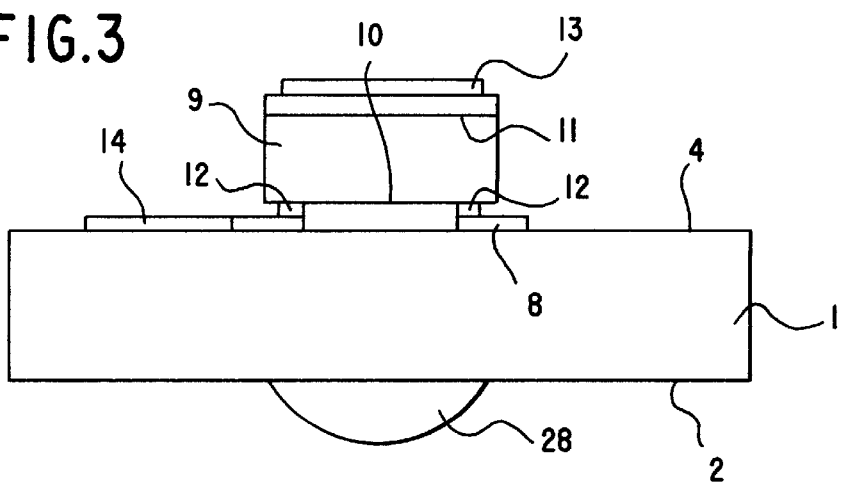
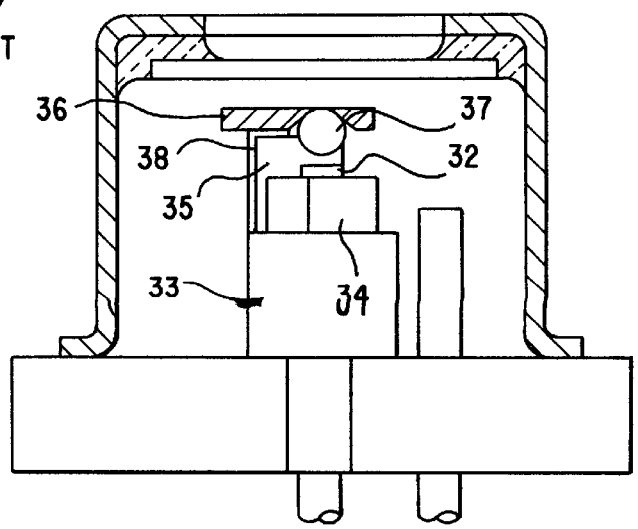
FIG.5 PRIOR ART

OPTOELECTRONIC TRANSDUCER AND PRODUCTION METHODS

CROSS-REFERENCE TO RELATED APPLICATION

This application is a continuation of International Application Serial No. PCT/DE96/01316, filed Jul. 18, 1996, which designated the United States.

BACKGROUND OF THE INVENTION

Field of the Invention

The invention relates to an optoelectronic transducer formed of a radiation emitting and/or receiving semiconductor component fastened to a carrier plate such that the beam exit/entry region of the semiconductor device is directed towards the carrier plate. The carrier plate is transparent to the emitted and/or received radiation. There is provided a device for focusing the radiation emitted and/or received by the semiconductor device. Finally, the beam exit/entry region is provided with a first metallization layer which is electrically conductively connected to a second metallization layer disposed on the carrier plate.

Such an optoelectronic transducer is disclosed in Published European Patent Application 412 184 A1 corresponding to U.S. Pat. No. 5,255,333. The European Patent teaches a transducer which has a radiation detector arrangement and is configured with a detector component, for example a photodiode, a common carrier, an insulating body, a fastening part, a lens carrier and a lens for focusing the radiation received by the detector component. The detector component is fastened by its underside to the insulating body, which is in turn fastened to the common carrier. The fastening part is arranged next to the insulating body on the common carrier. The lens carrier with the lens is fixed to the fastening part by a fastening layer in such a way that the lens is situated above the beam entry face of the detector element.

The mounting of the individual components of such an optoelectronic transducer is very complicated. It requires a large number of method steps and the adjustment of the lens is very difficult. Moreover, large reflection losses may occur on account of an air gap formed between the lens and the detector component.

International Publication No. WO92/10856, corresponding to U.S. Pat. Nos. 5,216,805 and RE35,069, discloses an optoelectronic component in which a photoelectric chip rests on bonding bumps of an optical element produced by injection molding. As an alternative, the bonding bumps can also be formed on the photoelectric chip. A gap filled with an optically transparent adhesive is present between the photoelectric chip and the optical element. Japanese Patent Publication No. JP 60-153184 describes a light-receiving element in which a photoelement chip is applied with its electrical contact on its light-receiving side onto an annular part of a bonding pad applied to a transparent substrate. An air gap is located between the photoelement chip and the substrate.

The above mentioned components have the disadvantage that the reflection losses at the transition area (i.e. air gap) from the chip to the optical element or substrate are relatively large.

SUMMARY OF THE INVENTION

It is accordingly an object of the invention to provide an optoelectronic transducer and production method therefor which overcomes the above-mentioned disadvantages of the prior art devices and methods of this general type, in which an optoelectronic transducer can be produced in large numbers in a simple and cost-effective manner and has minimum reflection losses.

With the foregoing and other objects in view there is provided, in accordance with the invention, an optoelectronic transducer comprising a carrier plate; a radiation-emitting and/or receiving semiconductor component fastened to the carrier plate, the semiconductor component has a beam exit/entry face directed towards the carrier plate, the carrier plate is transparent to emitted and received radiation; a device for focusing radiation emitted and received by the semiconductor component; the beam exit/entry face has at least one first contact metallization layer, the carrier plate has a second contact metallization layer, the first contact metallization layer and the second contact metallization layer are electrically conductively connected to one another; and a distance between the beam exit/entry face of the semiconductor component and the carrier plate is less than or equal to one-tenth of a wavelength of the emitted and received radiation.

In accordance with an added feature of the invention, the carrier plate has an island with a surface, and the beam exit/entry face of the semiconductor component is seated on the surface of the island.

In accordance with another feature of the invention, the carrier plate has a depression formed therein, the second contact metallization layer is disposed in the depression and the island is surrounded by the depression.

In accordance with an additional feature of the invention, the carrier plate is formed from a semiconductor material which is transparent to the emitted and received radiation.

In accordance with yet another added feature of the invention, the device for focusing the radiation is integrally formed with the carrier plate.

In accordance with yet another additional feature of the invention, the device for focusing the radiation is produced separately and connected to the carrier plate.

In accordance with yet another feature of the invention, the device for focusing the radiation is a converging lens.

In accordance with yet a further feature of the invention, the device for focusing the radiation is a diffractive optical element.

In accordance with yet another further added feature of the invention, the device for focusing the radiation and the semiconductor component are disposed on opposite sides of the carrier plate.

With the foregoing and other objects in view there is also provided, in accordance with the invention, a method for producing an optoelectronic transducer which comprises providing a substrate wafer; applying a plurality of second contact metallization layers to the substrate wafer according to a defined grid pattern; fastening a plurality of semiconductor components having first contact metallization layers to the second contact metallization layers; and separating the substrate wafer according to the defined grid pattern.

Other features which are considered as characteristic for the invention are set forth in the appended claims.

Although the invention is illustrated and described herein as embodied in an optoelectronic transducer and production methods, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1c is a diagrammatic, sectional view of the first exemplary embodiment showing an exaggerated gap between a semiconductor device and the carrier plate;

FIG. 2 is a front elevational view of a second exemplary embodiment of the optoelectronic transducer;

FIG. 3 is a front elevational view of a third exemplary embodiment of the optoelectronic transducer;

FIG. 5 is a sectional view of the optoelectronic transducer according to the prior art.

DESCRIPTION OF THE PREFERRED EMBODIMENTS

Figure 1A:
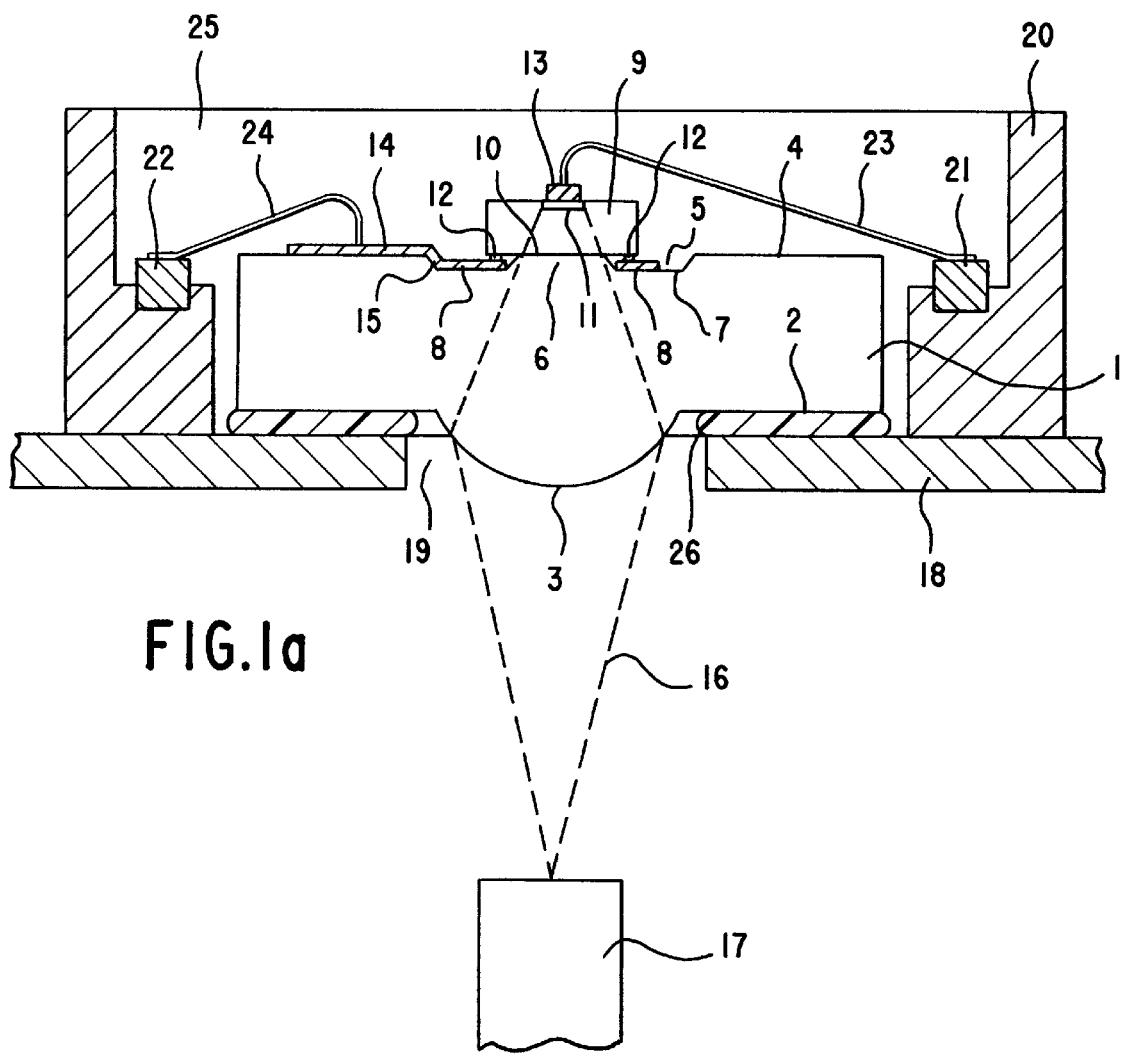
FIG. 1a is a diagrammatic, sectional view of a first exemplary embodiment of an optoelectronic transducer according to the invention.
Figure 1B:
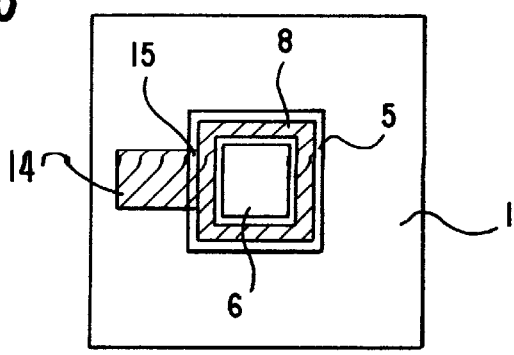
FIG. 1b is a sectional, top plan view of a carrier plate of the first exemplary embodiment.

Referring now to the figures of the drawing in detail and first, particularly, to FIG. 1a thereof, there is shown an optoelectronic transducer constructed on a carrier plate 1 and containing a radiation-emitting and/or receiving semiconductor component 9 and a lens 3 having a spherical or an aspherical surface. The semiconductor component 9 is, for example, a light-emitting diode, a photodiode or a vertical cavity surface emitter laser (VCSEL). The carrier plate 1 is composed, for example, of glass, plastic, sapphire, diamond or a semiconductor material which is transparent to the radiation emitted and/or received by the semiconductor component 9. For example, SiC can be used for radiation wavelengths $\lambda > 400$ nm, GaP can be used for $\lambda > 550$ nm, GaAs can be used for $\lambda > 900$ nm and silicon can be used for $\lambda > 1100$ nm. The lens 3 is constructed on the underside 2 of the carrier plate 1. On a top side 4, the carrier plate 1 has a trapezoidal depression 5 which, when observed from a plan view direction, has the form of a rectangular or square frame as shown in FIG. 1b. A rectangular or square island 6 is consequently formed within the frame.

A conductive layer which forms a conductive frame 8 around the island 6 is applied to a bottom surface 7 of the depression 5. The conductive frame 8 is composed, for example, of aluminum or of an aluminum alloy. It is also conceivable that in the case of using a carrier plate 1 made of a semiconductor material, the conductive frame 8 is formed in the depression 5 by a suitable doping. In order to fabricate such a conductive frame 8 produced by the doping of the carrier plate 1, it is possible to use those methods which are currently known to a person of average skill in the art, such as ion implantation.

The semiconductor component 9 has a central contact metallization layer 13 on its top side and two lateral contact metallization layers 12 on its underside. The contact metallization layers 12 are connected to the conductive frame 8 in an electrically conductive and mechanically robust manner such as soldering and/or adhesive bonding, and are configured in such a way that the semiconductor component 9 is seated with its beam exit face/entry face 10 on the island 6.

The beam exit face 10 of the radiation-emitting semiconductor component 9 is that face through which the majority of the electromagnetic radiation generated at a pn-junction 11 of the semiconductor component 9 exits from the semiconductor component 9. Analogously to this, the beam entry face 10 of a radiation-receiving semiconductor component 9 is that face through which electromagnetic radiation enters the semiconductor component 9.

Since the conductive frame 8 is also used to supply current to the semiconductor component 9, a terminal area 14, such as a bonding pad, is applied to the top side 4 of the carrier plate 1 for the purpose of making an external contact. The terminal area 14 is connected to the conductive frame 8 via an electrically conductive connecting layer 15. The terminal area 14 and the connecting layer 15 are advantageously composed of the same material as the conductive frame 8.

In the case of the radiation-emitting semiconductor component 9, for example an LED, the radiation 16 generated in the pn-junction 11 of the semiconductor component 9 exits from the semiconductor body of the semiconductor component 9 and passes through the carrier plate 1 and is then focused on the lens 3. This ensures that a large part of the radiation 16 generated in the semiconductor component 9 can be coupled into an optical fiber 17.

The thickness of the carrier plate 1 depends on the lens parameters (for example focal length) of the lens 3 and on the desired imaging (magnification or reduction in size) of the light spot onto the optical fiber 17. The same applies analogously in the case of coupling radiation 16 out of an optical fiber 17 into a radiation-receiving semiconductor component 9.

A significant advantage of the exemplary embodiment shown in FIG. 1a consists, inter alia, in the fact that because the radiation exit/entry face 10 of the semiconductor component 9 directly adjoins the carrier plate 1 (physical contact; this should be understood to be the distance between the semiconductor body and the carrier plate 1 of $s \leq \lambda/10$ as shown by the exaggerated distance or gap in FIG. 1c), significantly smaller reflection losses occur than in the case of the known transducer shown in FIG. 5.

FIG. 5 shows a prior art optoelectronic transducer configured with a detector component 32, for example a photodiode, a common carrier 33, an insulating body 34, a fastening part 35, a lens carrier 36 and a lens 37 for focusing the radiation received by the detector component 32. The detector component 32 is fastened by its underside to the insulating body 34, which is in turn fastened to the common carrier 33. The fastening part 35 is disposed next to the insulating body 34 on the common carrier 33. The lens carrier 36 with the lens 37 is fixed to the fastening part 35 by a fastening layer 38 in such a way that the lens 37 is situated above the beam entry face of the detector element 32.

In the case of the prior art, namely, on account of the greatly different refractive indices of air and the semiconductor material, the critical angle of total reflection is comparatively small for the transition of the radiation from air to the semiconductor material and, consequently, the radiation loss due to total reflection is very large.

The optoelectronic transducer with a coupling optical system shown in FIG. 1a is installed in a housing having a baseplate 18 with an opening 19, a housing side wall 20, external electrical terminals 21, 22, connecting wires 23, 24 and a plastic encapsulation 25 for hermetic sealing the transducer. Instead of the plastic encapsulation 25, a housing cover which is adhesively bonded or soldered onto the housing side wall 20 may also be used for hermetic sealing the housing. The optoelectronic transducer is fastened to the baseplate 18 by a fastening and sealing layer 26, for example an adhesive and/or solder, in such a way that the lens 3 comes to lie over or in the opening 19. The contact metallization layer 13 and the terminal area 14 are connected to the external electrical terminals 21,22 by the connecting wires 23, 24. The external electrical terminals 21, 22 are routed to the outside through the side wall 20.

A second exemplary embodiment of the optoelectronic transducer with the coupling optical system is shown in FIG. 2 and is in principle, identical to the first exemplary embodiment shown in FIG. 1a. Instead of the lens 3 having a spherical or aspherical surface, the carrier plate 1 has a diffractive optical element 27, which is designated by the abbreviation DOE for the purpose of focusing the radiation. Moreover, and unlike the first exemplary embodiment, the carrier plate 1 has a planar top side 4 to which the conductive frame 8 is applied. The conductive frame 8 is adjoined on one side by the electrical terminal area 14. The semiconductor component 9, for example a light-emitting diode, a photodiode or a vertical cavity surface emitter laser (VCSEL), is fastened on the frame in such a way that the beam exit/entry face 10 and the area enclosed by the frame 20 are disposed above one another, and that the contact metallization layers 12 of the semiconductor component 9 are seated on the electrically conductive frame 8. The contact metallization layers 12 are connected to the metal layer 8 in an electrically conductive and mechanically robust manner such as by solder and/or adhesive.

In the exemplary embodiment shown in FIG. 2, an air gap is formed between the semiconductor component 9 and the carrier plate 1. As already mentioned above, this air gap can cause considerable radiation losses due to total reflection in the event of a large difference between the refractive indices of air and the carrier plate material. If appropriate, the semiconductor component 9 or, as shown in FIG. 1a, the top side 4 of the carrier plate 1 must be configured in such a way that the beam exit/entry face 10 of the semiconductor component 9 is seated on the carrier plate 1. Instead of this, however, a suitable coupling medium 39, for example a transparent casting resin (for example epoxy resin), may also be introduced between the semiconductor component 9 and the carrier plate 1.

A third exemplary embodiment of the optoelectronic transducer is shown in FIG. 3 and differs from the two preceding exemplary embodiments essentially by virtue of the fact that the focusing device is not constructed in the carrier plate 1, rather a prefabricated spherical or aspherical lens 28 is fastened onto the carrier plate 1. Instead of the prefabricated lens 28, it is also possible, in a fourth exemplary embodiment, to fasten a prefabricated diffractive optical element onto the underside 2 of the carrier plate 1.

The use of a holographic optical element or of a Fresnel lens instead of the spherical or aspherical lens 28 or the DOE is also conceivable. Furthermore, it is also conceivable to arrange the device for focusing the radiation and the semiconductor component 9 on the same side of the carrier plate 1.

Figure 4:
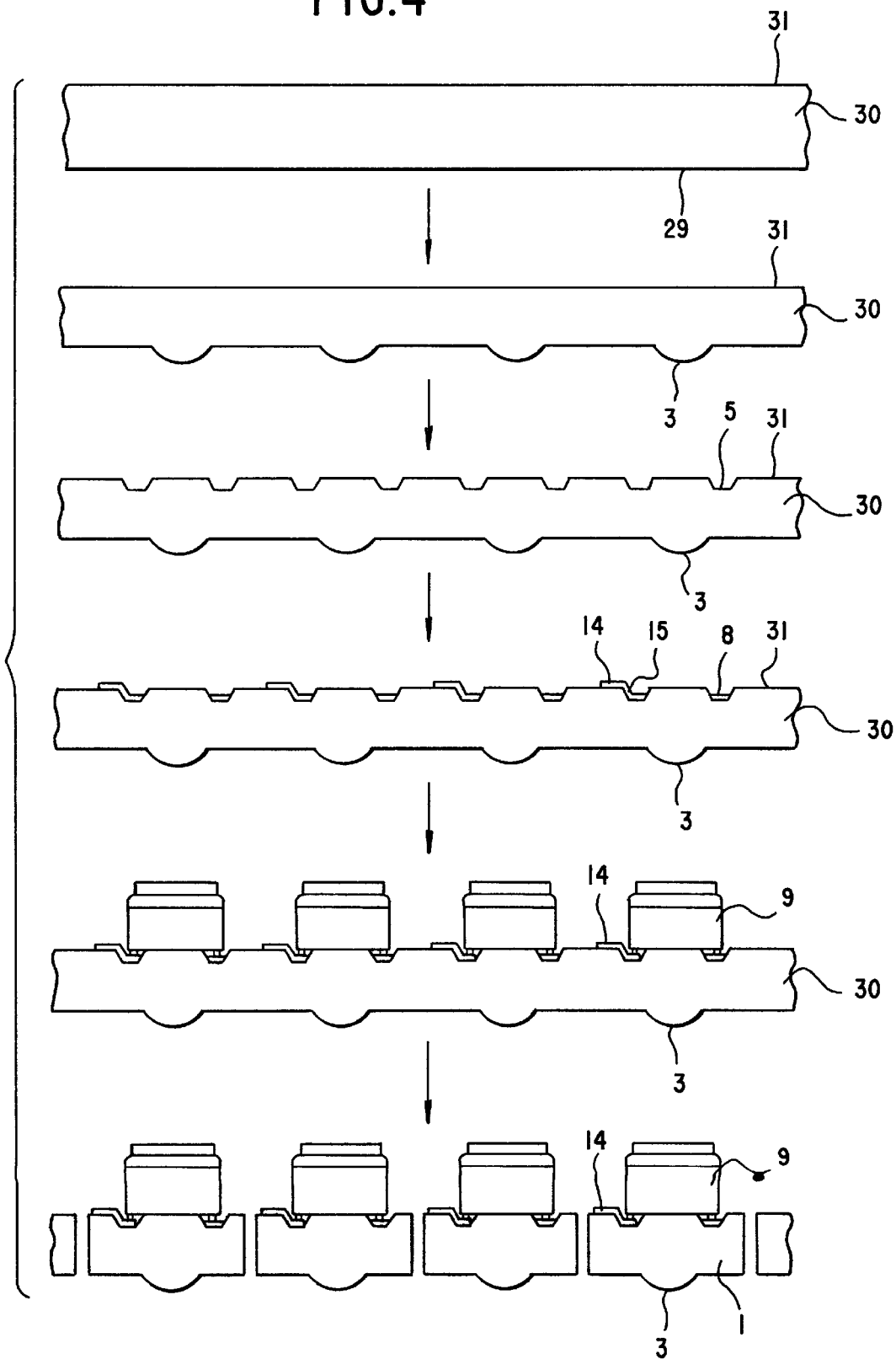
FIG. 4 is a diagrammatic view of a sequence of method steps for producing the optoelectronic transducer according to the exemplary embodiments of FIG. 1a or FIG. 2.

In order to simultaneously produce a plurality of optoelectronic transducers according to FIG. 1a, a plurality of spherical or aspherical lenses 3 are first produced on the underside 29 of a substrate wafer 30 according to a predetermined grid pattern, as shown in FIG. 4. The substrate wafer 30 is produced, for example, from glass or from silicon, and the lenses 3 are produced by etching and/or grinding, for example. A plurality of depressions 5 are subsequently formed on the top side 31 of the substrate wafer 30 according to the predetermined grid pattern by etching and/or grinding, for example. As the next step, a plurality of conductive frames 8, a plurality of connecting layers 15 and a plurality of terminal areas 14 are simultaneously applied into the depressions 5 or onto the top side 31 of the substrate wafer 30 according to the predetermined grid pattern by vapor deposition or sputtering, for example. Afterwards, a plurality of radiation-emitting and/or receiving semiconductor components 9 are fastened according to the predetermined grid pattern. This is done, for example, by soldering and/or adhesively bonding the contact metallization layers 12 onto the conductive frames 8. As the next step, the semiconductor wafer 30 is separated into individual optoelectronic transducers by sawing or scribing and breaking.

The technique of separating a substrate wafer 30 into small chips has long been known in semiconductor technology and can likewise be employed when separating the composite formed of the substrate wafer 30 and the plurality of semiconductor components 9 and lenses 3. It is customary here to fix the composite on an elastic adhesive film prior to the separation. The film then serves as a carrier in all of the subsequent processes.

A method for the production of a plurality of optoelectronic transducers according to the second exemplary embodiment has essentially the same steps as the method described above. The only difference is that instead of the lenses 3, a plurality of diffractive optical elements 27 are formed on the underside 29 of the substrate wafer 30.

A method for the production of a plurality of optoelectronic transducers according to the third and fourth exemplary embodiments differs from the above mentioned method by virtue of the fact that a plurality of the conductive frames 8 and the terminal areas 14 are first applied to the top side 31 of the substrate wafer 30 according to the predetermined grid pattern.

A plurality of prefabricated lenses 28 or diffractive optical elements are subsequently applied to the underside 29 of the substrate wafer 30 according to the predetermined grid pattern by soldering and/or adhesive bonding, for example.

A method is also conceivable in which a plurality of the conductive frames 8 and the terminal areas 14 are applied to the first substrate wafer 30 according to the predetermined grid pattern and a plurality of the lenses 3, 28 having the spherical surface or a plurality of the diffractive optical elements 27 are formed or applied on a second substrate wafer. The two substrate wafers are subsequently connected to one another by of soldering and/or adhesive bonding, in such a way that their planar sides lie on top of one another. The further method steps are the same as in the methods described above.

If the prefabricated lenses 28 or the prefabricated DOEs or the second substrate wafer are composed of glass and the substrate wafer 30 or the first substrate wafer is composed of silicon, or vice versa, then these two components can also be connected to one another by anodic bonding, for example. In this known technique, the surfaces to be connected are placed on top of one another and heated to 450° C., for example, and a voltage of about −1000 v is applied to the glass.

It is also advantageous for the exemplary embodiments three and four described above if the prefabricated lenses 28 or the prefabricated DOEs are composed of a material having a thermal expansion coefficient which is similar to that of the material of the substrate wafer 30. It is thereby possible to reduce mechanical stresses arising during production as well as during operation of the optoelectronic transducers.

I claim:

1. An optoelectronic transducer, comprising:
   a carrier plate;
   at least one of a radiation-emitting and receiving semiconductor component fastened to said carrier plate, said semiconductor component having a beam exit/entry face directed towards said carrier plate, said carrier plate transparent to radiation emitted and received by said semiconductor device;
   a device for focusing the radiation emitted and received by said semiconductor component;
   said beam exit/entry face having at least one first contact metallization layer, said carrier plate having a second contact metallization layer, said first contact metallization layer and said second contact metallization layer electrically conductively connected to one another; and
   said beam exit/entry face of said semiconductor component and said carrier plate defining a distance therebetween of at most one-tenth of a wavelength of the emitted and received radiation.

2. The optoelectronic transducer according to claim 1, wherein said carrier plate has an island with a surface, and said beam exit/entry face of said semiconductor component is seated on said surface of said island.

3. The optoelectronic transducer according to claim 1, wherein said carrier plate is formed from a semiconductor material transparent to the emitted and received radiation.

4. The optoelectronic transducer according to claim 1, wherein said device for focusing the radiation is integrally formed with said carrier plate.

5. The optoelectronic transducer according to claim 1, wherein said device for focusing the radiation is produced separately and connected to said carrier plate.

6. The optoelectronic transducer according to claim 1, wherein said device for focusing the radiation is a converging lens.

7. The optoelectronic transducer according to claim 1, wherein said device for focusing the radiation is a diffractive optical element.

8. The optoelectronic transducer according to claim 1, wherein said device for focusing the radiation and said semiconductor component are disposed on opposite sides of said carrier plate.

9. The optoelectronic transducer according to claim 2, wherein said carrier plate has a depression formed therein, said second contact metallization layer is disposed in said depression and said island is surrounded by said depression.

* * * * *